United States Patent [19]

Tseng

[11] Patent Number: 5,670,406
[45] Date of Patent: Sep. 23, 1997

[54] METHOD OF MAKING A TOOTH SHAPED CAPACITOR

[75] Inventor: Horng-Huei Tseng, Hsinchu, Taiwan

[73] Assignee: Vanguard International Semiconductor Corporation, Hsinchu, Taiwan

[21] Appl. No.: 791,505

[22] Filed: Jan. 30, 1997

[51] Int. Cl.⁶ .................................................. H01L 21/70
[52] U.S. Cl. .............. 437/52; 437/919; 437/917; 148/DIG. 138
[58] Field of Search ...................... 437/47, 48, 52, 437/60, 919, 977; 148/DIG. 138

[56] References Cited

U.S. PATENT DOCUMENTS

| | | | |
|---|---|---|---|
| 5,134,086 | 7/1992 | Ahn | 437/52 |
| 5,427,974 | 6/1995 | Lue et al. | 437/60 |
| 5,464,791 | 11/1995 | Hirota | 437/60 |
| 5,567,637 | 10/1996 | Hirota | 437/43 |

*Primary Examiner*—John Niebling
*Assistant Examiner*—Joni Y. Chang
*Attorney, Agent, or Firm*—Christensen O'Connor Johnson & Kindness, PLLC

[57] ABSTRACT

A method of manufacturing a capacitor for use in semiconductor memories is disclosed herein. The present invention includes forming anti-oxidizing regions from dot silicon for use as an oxidation mask to oxidize a polysilicon layer. Further, a silicon oxide layer is used as an etching mask to form a bottom storage node of a capacitor. An etching process is performed to etch a portion of the first polysilicon layer. Next, the silicon oxide layer is removed to define the bottom storage node. Utilizing the bottom storage node structure, the present invention can be used to increase the surface area of the capacitor.

16 Claims, 4 Drawing Sheets

METHOD OF MAKING A TOOTH SHAPED CAPACITOR

FIELD OF THE INVENTION

The present invention relates to semiconductor capacitors, and more specifically, to a method of making a tooth shaped capacitor for a DRAM cell.

BACKGROUND OF THE INVENTION

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lower signal to noise ratio and undesirable signal problems. The desired large scale integration in DRAM devices along with reliable operation can be achieved by using DRAM storage capacitors with a high storage capacitance relative to its cell area.

Efforts to maintain or increase the storage capacitance in memory cells with greater packing densities have included the use of a capacitor design in which the capacitor cell uses the space over the MOSFET device area for the capacitor plates. In a recent prior art DRAM, one of the two electrodes of a storage capacitor is formed to have a three-dimensional structure. This makes the capacitance larger by 30% to 40% than that of a two-dimensional storage capacitor having the same size as the three-dimensional one.

For example, a three-dimensional stacked capacitor is disclosed in U.S. Pat. No. 5,053,351. The storage node plate of this capacitor has an E-shaped cross-section. In another example, a hemispherical-grain (HSG) polysilicon storage node has been proposed (see "A New Cylindrical Capacitor Using Hemispherical-Grain Si for 256 Mb DRAMs", H. Watanabe et al., Microelectronics Research Laboratories, NEC Corporation). This memory cell provides a large storage capacitance by increasing the effective area of a simple storage node. However, the complex capacitor shapes tend to be difficult to fabricate and the standard processes need at least two masks for the complex capacitor shapes, and more particularly, for the toothed-shape capacitor node. Therefore, there is a need for a capacitor node with a high surface area that is simple to manufacture.

SUMMARY OF THE INVENTION

A method for manufacturing a capacitor on a semiconductor substrate is disclosed. The method comprises the steps of: forming a first conductive layer over said substrate; forming a dot silicon layer on said first conductive layer; doping oxygen into said dot silicon layer using an oblique angle to form anti-oxidation regions; thermal annealing said semiconductor substrate in an inert gas ambient to convert said dot silicon layer into silicon oxide; removing a portion of said first conductive layer using said silicon oxide as a mask; patterning and etching said first conductive layer to form a first storage node of said capacitor; forming a dielectric layer on the surface of said first storage node of said capacitor; and forming a second conductive layer over said dielectric layer to act as a second storage node of said capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the capacitor described herein includes many process steps that are well known in the art. For example, the processes of photolithography masking and etching are well known in the art and are used extensively herein without a related discussion of these well known technologies.

Figure 1:
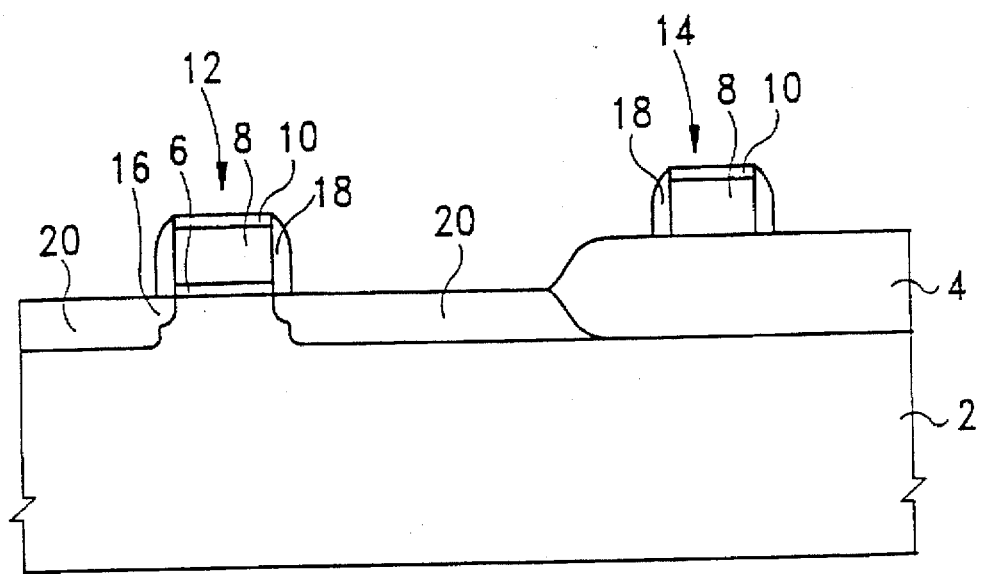
FIG. 1 is a cross section view of a semiconductor wafer illustrating the step of forming a gate structure on a semiconductor substrate.

Referring to FIG. 1, a P-type single crystal silicon substrate 2 with a <100> crystallographic orientation is provided. An isolation region 4 is formed using any suitable technique such as thick field oxide (FOX) or trench isolation technology. In the present invention, a thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms.

Next, a silicon dioxide layer 6 is created on the top surface of the substrate 2 to serve as the gate oxide for subsequently formed Metal Oxide Silicon Field Effect Transistors (MOSFETs). In one embodiment, the silicon dioxide layer 6 is formed by using an oxygen ambient, at a temperature of about 800° to 1100° C. Alternatively, the oxide layer 6 may be formed using any suitable oxide chemical compositions and procedures. In the preferred embodiment, the thickness of the silicon dioxide layer 6 is approximately 30–200 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 2000–4000 angstroms. A capped oxide layer 10 is formed on the first polysilicon layer 8. Next, standard photolithography and etching steps are used to form a gate structure 12 and a word line 14. Then a LDD (lightly doped drain) structure 16 is formed by light ion implantation. Sidewall spacers 18 are generated by using well known techniques, and, subsequently, active regions 20 (i.e. the source and the drain) are formed by using well known processes to implant appropriate impurities in those regions.

Figure 2:
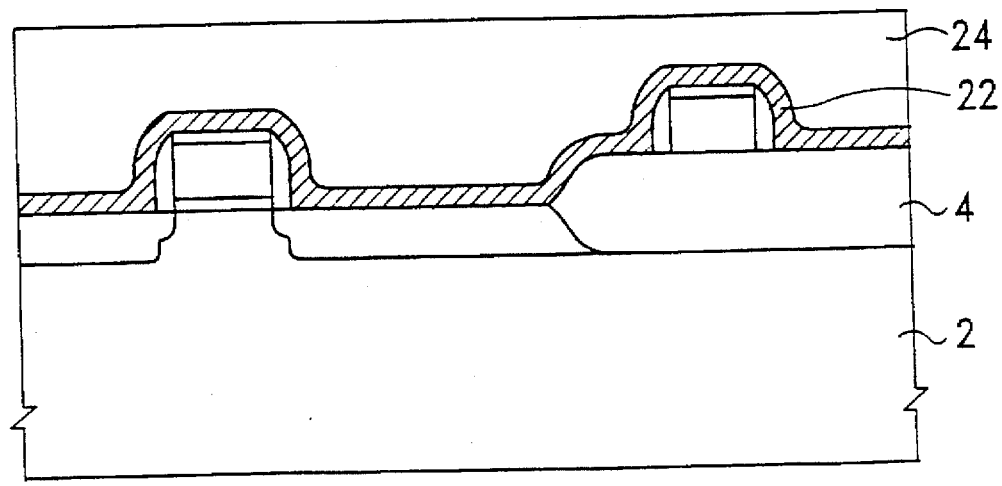
FIG. 2 is a cross section view of a semiconductor wafer illustrating the step of forming an oxide layer and a first dielectric layer on the semiconductor substrate.

Turning next to FIG. 2, an undoped oxide layer 22 is deposited using a CVD process on the gate structure 12, the word line 14, and the substrate 2. The thickness of the oxide layer 22 is about 1500 angstroms. A first dielectric layer 24 is then formed on the undoped oxide layer 22. The first dielectric layer 24 can be formed by using any suitable material such as borophosphosilicate glass (BPSG) or TEOS-oxide. The thickness of the first dielectric layer 24 is preferably about 3000–8000 angstroms.

Figure 3:
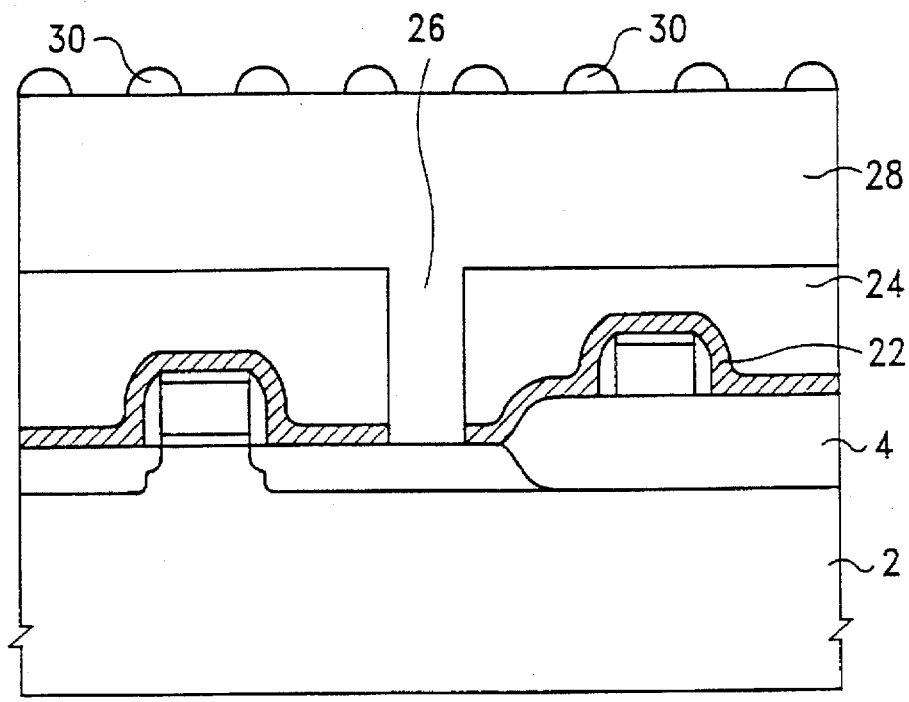
FIG. 3 is a cross section view of a semiconductor wafer illustrating the step of forming a contact hole in the first dielectric layer and the oxide layer, and forming a first conductive layer on the first dielectric layer, in the contact hole, and forming a HSG-Si layer on the first conductive layer.

As shown in FIG. 3, a contact hole 26 is formed in the first dielectric layer 24 and the oxide layer 22 to the active regions 20 by using conventional patterning and etching. A first conductive layer 28 is then formed over and in the contact hole 26 and on the first dielectric layer 24. The first conductive layer 28 is preferably formed using conventional LPCVD processing. The thickness of the first conductive layer 28, as measured over the first dielectric layer 24, is optimally 2000–6000 angstroms. The first conductive layer 28 is preferably chosen from doped polysilicon or in-situ doped polysilicon.

Subsequently, a dot silicon layer 30 is formed on the first conductive layer 28. Preferably, the dot silicon layer 30 consists of a Hemispherical Grained Silicon (HSG-Si) layer 30 that is formed by the "initial phase" technique. The HSG-Si layer 30 serves as an etching mask for subsequent processes. Other techniques currently available or developed in the future may also be used to form the dot silicon layer 30. The advantage of using dot silicon layer 30 is that the dot silicon layer 30 can be deposited with a resolution that is beyond the limitation of current photolithography techniques. The HSG-Si layer 30 is formed with a thickness about 50–1000 angstroms.

Figure 4:
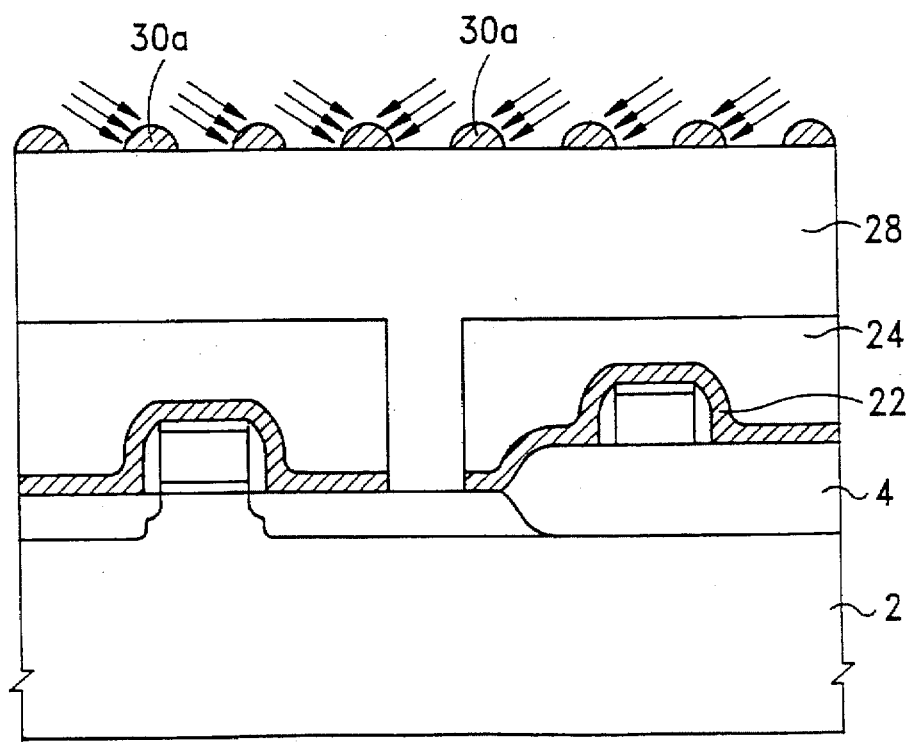
FIG. 4 is a cross section view of a semiconductor wafer illustrating the step of forming anti-oxidizing regions.

Turning next to FIG. 4, nitrogen is implanted at an oblique angle into the dot silicon layer 30 thus forming anti-oxidation regions ($SiN_x$) 30a. The angle of the implant is from 0 to 45 degrees. The advantage of the oblique implant is that the HSG-Si 30 acts as a mask to prevent the first conductive layer 28 from being bombarded by the implant. Therefore, only the HSG-Si 30 is implanted by nitrogen.

Figure 5:
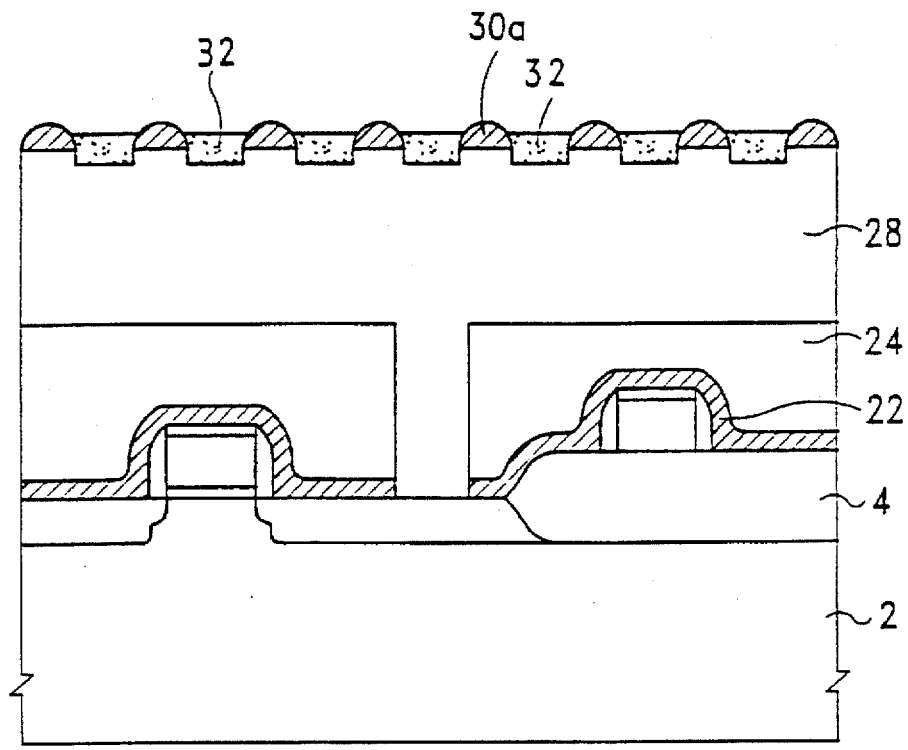
FIG. 5 a cross section view of a semiconductor wafer illustrating the step of etching the first conductive layer using the anti-oxidizing regions as an etching mask.

Next, as shown in FIG. 5, a thermal oxidation is carried out in an oxygen ambient. The regions that are not covered by the anti-oxidation regions 30a are oxidized to from a silicon oxide layer 32 on the surface of the first conductive layer 28. The temperature of the oxidation is about 700°–900° C. Further, the anti-oxidation regions 30a may be converted into ($SiN_xO_{1-x}$).

Figure 6:
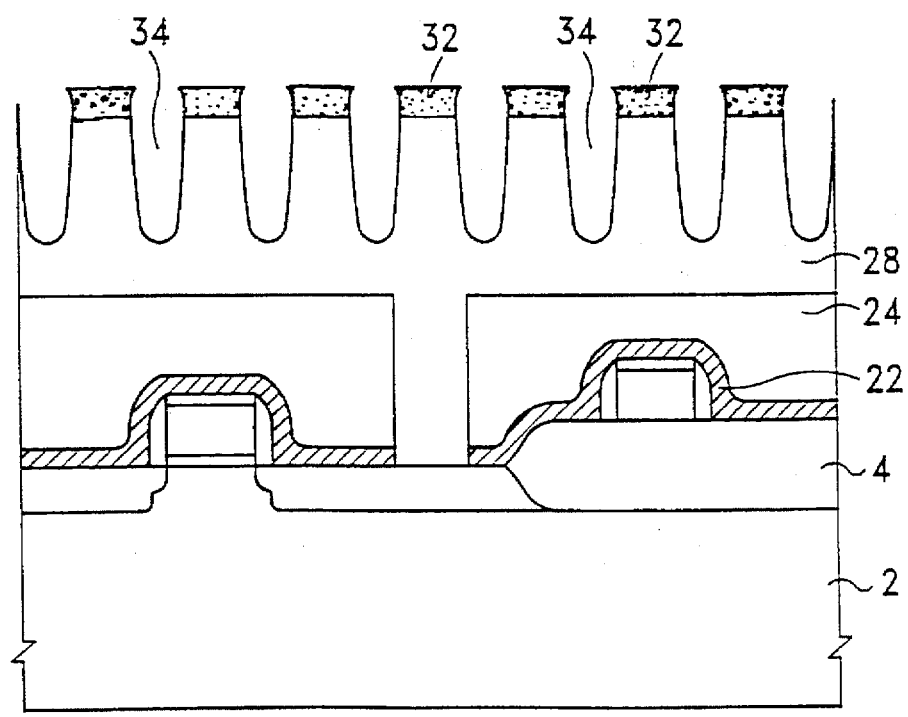
FIG. 6 is a cross section view of a semiconductor wafer illustrating the step of etching the first conductive layer and the anti-oxidizing regions using the silicon oxide as an etching mask.

Next, as seen in FIG. 6, the anti-oxidation regions 30a and a portion of the first conductive layer 28 is etched using the silicon oxide layer 32 as an etching mask. The present invention uses the high etching selectivity between the silicon oxide layer 32 and the polysilicon 28, and the anti-oxidation regions 30a to create cavities 34 in the first conductive layer 28. Any suitable etchant can be used for this etching, such as $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$. The etching is preferably reactive ion etching (RIE).

Figure 7:
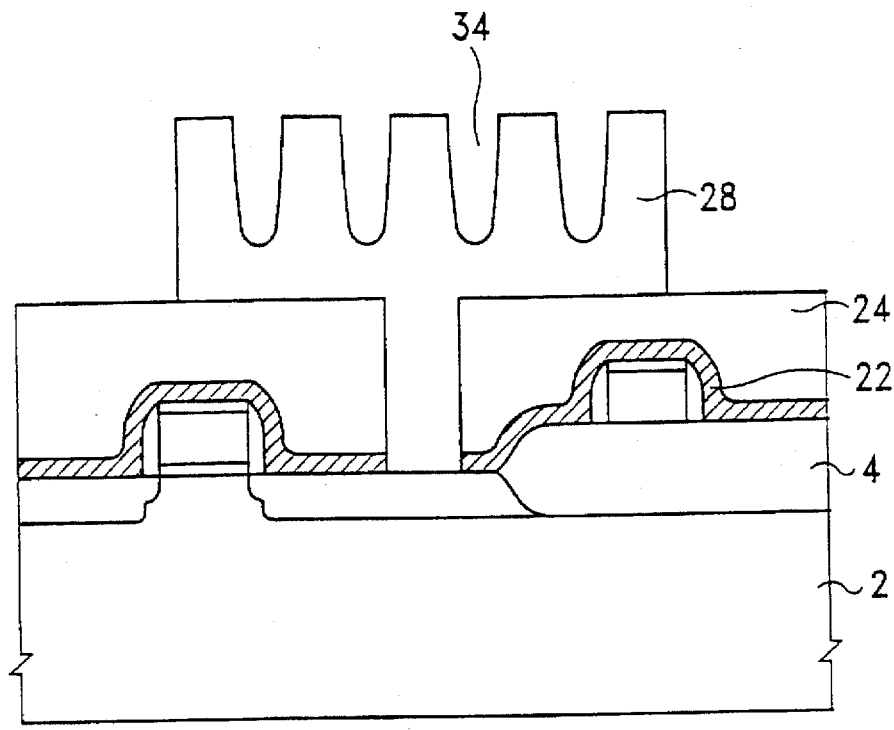
FIG. 7 is a cross section view of a semiconductor wafer illustrating the step of forming a bottom storage node of a capacitor.

Referring to FIG. 7, the silicon oxide layer 32 is then removed by using wet etching. In the preferred embodiment, buffer oxide etching (BOE), vapor HF or diluted HF solution is used as an etchant. Next, a photoresist is patterned on the first conductive layer 28. An etching process subsequently is used to etch the first conductive layer 28 that is uncovered by the photoresist. The photoresist is then removed and the resulting structure is used as a bottom storage node 28 of a capacitor.

Figure 8:
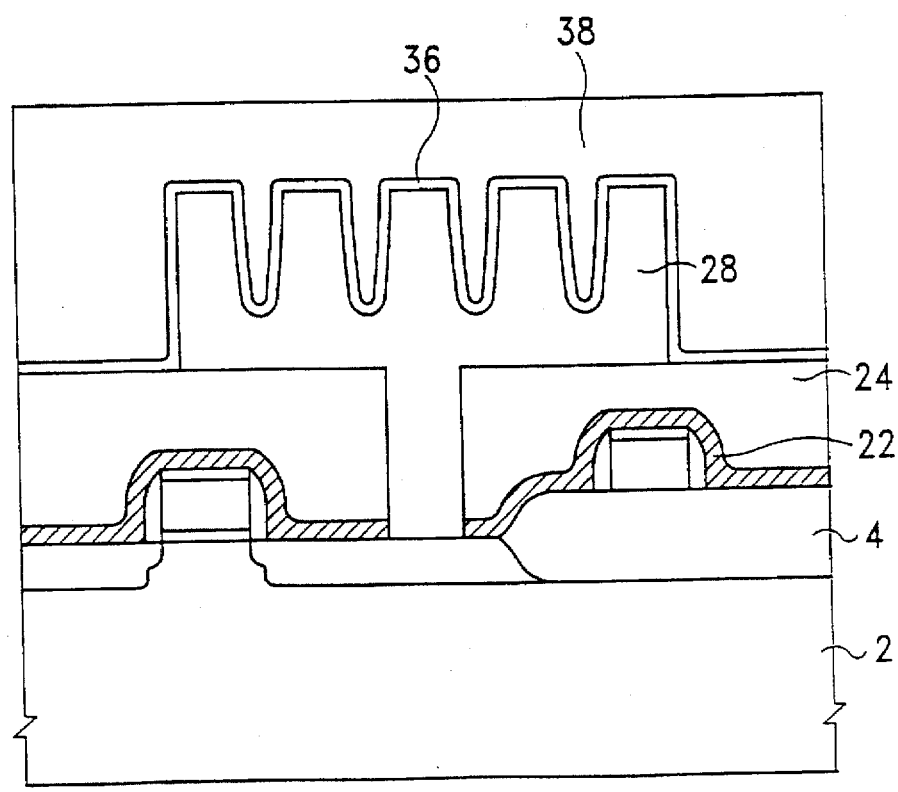
FIG. 8 is a cross section view of a semiconductor wafer illustrating the step of depositing a second dielectric layer on said bottom storage node and forming a second conductive layer on said second dielectric layer.

Turning now to FIG. 8, a second dielectric layer 36 is deposited along the surface of the first conductive layer 28. The second dielectric layer 36 is preferably formed of either a double-film of nitride/oxide film, a triple-film of oxide/nitride/oxide, or any other high dielectric film such as tantalum oxide ($Ta_2O_5$), BST. Finally, a second conductive layer 38 is deposited using a conventional LPCVD process over the second dielectric layer 36. The second conductive layer 38 serves as a top storage node and is formed of doped polysilicon, in-situ doped polysilicon, aluminum, copper, tungsten or titanium.

As will be understood by persons skilled in the art, the foregoing preferred embodiment of the present invention is illustrative of the present invention rather than limiting the present invention. For example, the method of the present invention can also be used in a COB (capacitor over bit line) structure. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

I claim:

1. A method for manufacturing a capacitor on a semiconductor substrate, said method comprising the steps of:

forming a first conductive layer over said substrate;

forming a dot silicon layer on said first conductive layer;

doping nitrogen into said dot silicon layer using an oblique angle to form anti-oxidation regions;

oxidizing said first conductive layer using said anti-oxidation regions as a mask to form a silicon oxide layer on said first conductive layer;

removing said anti-oxidation regions and a portion of said first conductive layer using said silicon oxide layer a mask;

patterning and etching said first conductive layer to form a first storage node of said capacitor;

forming a dielectric layer on the surface of said first storage node of said capacitor; and forming a second conductive layer over said dielectric layer to act as a second storage node of said capacitor.

2. The method of claim 1, wherein said first conductive layer is chosen from the group of doped polysilicon or in-situ doped polysilicon.

3. The method of claim 2, wherein said first conductive layer has a thickness in a range of about 2000–6000 angstroms.

4. The method of claim 1, wherein said dot silicon layer is a HSG-Si layer.

5. The method of claim 4, wherein said HSG-Si layer is formed to have a thickness of a range about 50–1000 angstroms.

6. The method of claim 2, wherein said step of removing said anti-oxidation regions and a portion of said first conductive layer is performed by an etching using an etchant chosen from the group of $C_2F_6$, $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

7. The method of claim 1, wherein the angle of said oblique angle implant is from 0 to 45 degree.

8. The method of claim 1, wherein said second conductive layer is selected from the group of doped polysilicon, in-situ doped polysilicon.

9. The method of claim 1, wherein the temperature of oxidizing said first conductive layer is about 700°–900° C.

10. A method of forming a silicon structure, said method comprising the steps of:

forming a silicon layer over a semiconductor substrate;

forming a dot silicon layer on said first conductive layer;

doping nitrogen into said dot silicon layer at an oblique angle to form anti-oxidation regions;

performing a thermal oxidation to said silicon layer in an oxygen ambient using said anti-oxidation regions as a mask to form a silicon oxide layer on said silicon layer;

removing said anti-oxidation regions and a portion of said silicon layer using said silicon oxide layer as a mask;

removing said silicon oxide layer on said silicon layer; and patterning and etching said silicon layer to form said silicon structure.

11. The method of claim 10, wherein the angle of said oblique implant is from 0 to 45 degree.

12. The method of claim 10, wherein the temperature of oxidizing said silicon layer layer is about 700°–900° C.

13. A method for manufacturing a capacitor on a semiconductor substrate, said method comprising the steps of:

forming a first polysilicon layer over said substrate;

forming a HSG-Si layer on said first polysilicon layer;

doping nitrogen into said HSG-Si layer at an oblique angle to form anti-oxidation regions;

oxidizing said first polysilicon layer using said anti-oxidation regions as a mask to form a silicon oxide layer on said first polysilicon layer;

removing said anti-oxidation regions and a portion of said first polysilicon layer using said silicon oxide layer as a mask;

removing said silicon oxide layer;

patterning and etching said first polysilicon layer to form a first electrode of said capacitor;

forming a dielectric layer on the surface of said first electrode of said capacitor; and forming a second polysilicon layer over said dielectric layer to act as a second electrode of said capacitor.

14. The method of claim 13, wherein said HSG-Si layer is formed to have a thickness of a range about 50–1000 angstroms.

15. The method of claim 13, wherein the angle of said oblique angle implant is from 0 to 45 degree.

16. The method of claim 13, wherein the temperature of oxidizing said first polysilicon layer is about 700°–900° C.

* * * * *